(12) United States Patent
Mueller et al.

(10) Patent No.: US 8,847,441 B2
(45) Date of Patent: Sep. 30, 2014

(54) DEVICE AND METHOD FOR GENERATING A CURRENT PULSE

(75) Inventors: Roland Mueller, Steinheim (DE); Gerhard Hueftle, Aspach (DE); Michael Horstbrink, Stuttgart-Feuerbach (DE); Tobias Lang, Stuttgart (DE); Sami Radwan, Stuttgart (DE); Bernd Kuenzl, Schwieberdingen (DE); Roland Wanja, Markgroeningen (DE)

(73) Assignee: Robert Bosch GmbH, Stuttgart (DE)

( * ) Notice: Subject to any disclaimer, the term of this patent is extended or adjusted under 35 U.S.C. 154(b) by 624 days.

(21) Appl. No.: 12/930,881

(22) Filed: Jan. 18, 2011

(65) Prior Publication Data

US 2011/0181322 A1 Jul. 28, 2011

(30) Foreign Application Priority Data

Jan. 22, 2010 (DE) .......................... 10 2010 001 154

(51) Int. Cl.
| | |
|---|---|
| *H03K 3/02* | (2006.01) |
| *H03K 3/64* | (2006.01) |
| *H03K 5/04* | (2006.01) |
| *H03K 5/156* | (2006.01) |
| *H03K 5/00* | (2006.01) |

(52) U.S. Cl.
CPC .. *H03K 3/64* (2013.01); *H03K 3/02* (2013.01); *H03K 5/04* (2013.01); *H03K 5/156* (2013.01); *H03K 2005/00293* (2013.01)
USPC ............ 307/139; 307/112; 307/116; 307/125

(58) Field of Classification Search
CPC ........................................................ H03K 3/02
USPC .................... 307/112, 116, 125, 139
See application file for complete search history.

(56) References Cited

U.S. PATENT DOCUMENTS

| | | | | |
|---|---|---|---|---|
| 4,321,488 | A | | 3/1982 | Srivastava |
| 4,356,410 | A | | 10/1982 | Miskin |
| 4,866,368 | A | * | 9/1989 | Bird .............................. 323/316 |
| 5,357,150 | A | * | 10/1994 | Jaquette .......................... 327/72 |
| RE34,772 | E | * | 11/1994 | Bernard et al. .............. 323/313 |
| 6,236,252 | B1 | * | 5/2001 | Genest et al. ................. 327/178 |
| 6,362,664 | B1 | * | 3/2002 | Camera et al. ................ 327/108 |
| 7,184,296 | B2 | * | 2/2007 | Hatakeyama et al. ........ 365/148 |
| 7,348,803 | B2 | * | 3/2008 | Bui et al. ........................ 326/82 |
| 7,521,980 | B2 | * | 4/2009 | Koen ............................ 327/308 |
| 7,952,342 | B2 | * | 5/2011 | Satoh ............................ 323/317 |
| 8,126,154 | B2 | * | 2/2012 | Bierl et al. ...................... 381/55 |
| 8,183,924 | B2 | * | 5/2012 | Gilbert .......................... 330/284 |

(Continued)

FOREIGN PATENT DOCUMENTS

DE   10 2006 041 531   3/2008

*Primary Examiner* — Adi Amrany
(74) *Attorney, Agent, or Firm* — Kenyon & Kenyon LLP (57) ABSTRACT

A device for producing a current pulse includes supply terminals for providing a power supply voltage, and a switch which is situated in a control current branch between the supply terminals, which switch is configured to switch a control current through the control current branch as a function of an actuation signal. The device also has a current mirror having a control transistor and a signal transistor, the control transistor being situated in series to the first switch in the control current branch, and the signal transistor being configured to provide the current pulse as a function of the control current through the control transistor.

11 Claims, 4 Drawing Sheets

(56) References Cited

U.S. PATENT DOCUMENTS

| | | | |
|---|---|---|---|
| 8,183,933 B2 * | 5/2012 | Halder et al. | 330/311 |
| 8,497,735 B2 * | 7/2013 | Gilbert | 330/254 |
| 2002/0011878 A1 * | 1/2002 | Kadowaki | 327/103 |

* cited by examiner

DEVICE AND METHOD FOR GENERATING A CURRENT PULSE

BACKGROUND OF THE INVENTION

1. Field of the Invention

The present invention relates to a device for generating a current pulse and to a corresponding method which may be used, for example, in connection with an ultrasonic transducer.

2. Description of the Related Art

Published German patent application document DE102006041531A1 describes a sensor circuit for a flow sensor which has terminal impedances connected in parallel to sound transducers, and which has a signal generator that is developed as a current source. The switching arrangement is particularly suitable for the operation of an air mass sensor in internal combustion engines.

BRIEF SUMMARY OF THE INVENTION

The present device provides a device for generating a current pulse and a method for generating a current pulse. The essence of the present invention is a current pulse generator having minimized power supply requirements. This enables a broadening of application possibilities to fields using little high-output power supply, i.e. there is slight current consumption of the circuit and a tolerance for fluctuations in the power supply voltage. According to the present invention, there also exists a simply adjustable pulse shape, e.g. for optimizing the EMC (electromagnetic compatibility).

The circuit according to the present invention represents a highly resistive current source which, for example, is able to supply an initial pulse for ultrasonic transducers. Only a brief initial pulse is typically required in this context. For instance, this may be an initial pulse having a duration of 10 ps, which repeats at a comparatively slow rhythm, e.g. after 1 ms. Thus, the current source is only used actively during about 1% of the time.

A mirror circuit is used as a current source, according to the present invention. It has a closed-circuit consumption which may be of an order of magnitude of 10% of the transmitting current. From this it follows that, during the transmitting pause, 10 times the power is used as for the transmitting process itself. Therefore, the present invention points out a possibility of reducing the closed-circuit consumption almost to zero, using little circuit engineering effort. Only leakage currents remain.

This advantage may be combined with an automatic adjustment of the transmitting current to the available power supply voltage. The background is that the current source must never reach saturation, so as not to lose its high output voltage. Just that happens, however, if, during dropping power supply voltage, the current remains unchanged, that is, at a load that remains equal, the voltage at the output also remains equal. In this case, voltage $U_{drop}=U_{in}-U_{load}$ dropping off at the source keeps on dropping until saturation sets in. Therefore, according to the present invention, the output current is reduced in response to the dropping power supply voltage, so that $U_{load}$ also decreases, and the available voltage difference $U_{drop}$ remains sufficiently large. Therefore, the circuit is always able to be operated at optimum efficiency, and a costly regulation of the power supply voltage may be omitted.

In addition, by selecting a suitable capacitance, one is able to set the pulse shape depending on whether one desires as rectangular a curve as possible of the output current, or rather a slower switching behavior having correspondingly less EMI radiation.

The present invention provides a device for generating a current pulse having the following features: a first supply terminal and a second supply terminal to make available a power supply voltage between the first and the second supply terminal; a first switch which is situated in a control-current branch between the first and the second supply terminal, and is developed to switch a control current through the control-current branch as a function of an actuation signal; and a current mirror having a control transistor and a signal transistor, the control transistor and the signal transistor each having a first terminal, a second terminal and a control terminal, and the control transistor being situated in series with the first switch in the control current branch, and the signal transistor being developed to make available the current pulse through the control transistor as a function of the control current.

The device may be an electrical circuit having a plurality of electrical components. The device may implement a high-resistance current source which, for example, is able to make available transmitting pulses for an ultrasonic transducer or one or more other loads. The device may have a suitable terminal for making available the current pulse to the load, or the load may be a part of the device. The first supply terminal may be a terminal for making available an operating voltage, and the second supply terminal may be a ground terminal. The current mirror may be a transistor circuit, by which a current flowing through a control transistor is copied and, multiplied by an optional factor, is able to be made available by the signal transistor. Thus, we are talking about a current-controlled current source. The first terminals of the transistors of the current mirror may be connected to the first supply terminal. The first switch and additional switches of the device may be developed as transistors. The first switch is able to interrupt the control current or transmit it, depending on which value or signal level the actuation signal has. If the first switch interrupts the current flow, the current mirror provides no current pulse. At the same time, the closed-circuit consumption of the whole circuit shown is reduced to zero, with the exception of leakage currents. The actuation signal and additional control signals are able to be provided by an appropriate control device.

According to one example embodiment, the device according to the present invention may have a terminal for providing the actuation signal. A control terminal of the first switch may be connected to the terminal for providing the actuation signal. A second terminal of the first switch may be connected to the second supply terminal. A control terminal of the control transistor may be connected to a control terminal of the signal transistor, a first terminal of the control transistor and a first terminal of the signal transistor may be connected to the first supply terminal, and a second terminal of the control transistor may be connected to a first terminal of the first switch, so that, as a function of the first actuation signal, the current pulse is able to be made available at a second terminal of the signal transistor. Consequently, the first switch is able to be situated between the signal transistor and the second supply terminal.

The first terminal of the signal transistor may be connected to the supply terminal via a first resistor, and the first terminal of the control transistor may be connected via a second resistor. This makes possible an adjustment of the currents by the current mirror.

The device according to the present invention may include a second switch, a third resistor, a fourth resistor and a fifth resistor. The second terminal of the control transistor, in this context, may be connected to a first terminal of the second switch, a second terminal of the second switch may be connected via the fourth resistor to the first terminal of the first switch, a control terminal of the second switch may be connected via the third resistor to the first supply terminal and via the fifth resistor to the first terminal of the first switch. Using the resistors, a magnitude of the control current, and thus the magnitude of the current pulse, may be adjusted to the supply voltage.

At least one of the resistors may have a nonlinear characteristics curve, in this context. In this way, one may implement a nonlinear relationship between the control current and the supply voltage.

The second terminal of the control transistor may also optionally be connected to the first terminal of the first switch via a resistor, and in this variant, too, a resistor of nonlinear characteristics curve may be used, in order to implement a nonlinear relationship between the control current and the supply voltage.

A current value of the current pulse may be approximately proportional to the power supply voltage, according to the present invention. Apart from leakage current influences, a proportionality factor may be set by the selection of the resistors.

The current value of the current pulse may be dependent on the power supply voltage. The current value of the current pulse, in this instance, may be linear or approximately linear to the power supply voltage. The current value of the current pulse may also be linear but not proportional to the power supply voltage. Accordingly, the current pulse may be a function of the input voltage or the power supply voltage.

According to one example embodiment, the device according to the present invention may have a capacitor, which is connected between the first supply terminal and the control terminal of the control transistor. By the suitable selection of a capacitance value of the capacitor, one may set the steepness of the curve of the current pulse in a simple manner.

Furthermore, the device according to the present invention may have at least one cascode circuit, which is coupled to the second terminal of the signal transistor, and is developed to provide the current pulse as a function of at least one control signal to a load. A plurality of cascode circuits may be connected, for example, in parallel between the second terminal of the signal transistor and the second supply terminal, each cascode circuit being able to be used for operating a load. Each cascode circuit may have a transistor that is able to be switched via a control signal.

The device may have at least one first cascode circuit and at least one second cascode circuit, for example. The first cascode circuit may be developed to make available the current pulse as a function of at least one first control signal to a first terminal of the load, in this context. The second cascode circuit may be developed to make available the current pulse as a function of at least one second control signal to a second terminal of the load. Thus, a load is able to be activated using two cascode circuits. Consequently, the load is able to be activated in a bipolar manner, whereby the power able to be made available to the load increases, and a d.c. component is avoided.

The at least one cascode circuit may have a cascode switch, in this instance, and a third switch, a control terminal of the third switch being able to be connected to a control terminal for providing a control signal, a first terminal of the third switch connected to the first supply terminal and a control terminal of the cascode switch, and a second terminal of the third switch connected to the second supply terminal. A first terminal of the cascode switch is able to be connected to the second terminal of the signal transistor and the current pulse is able to be provided at a second terminal of the cascode switch. Thus, each cascode circuit is able to be activated or deactivated via its own control signal. Alternatively, a control signal may also be used for activating a plurality of cascode circuits.

In this context, the device may have a first cascode circuit and a second cascode circuit, a second terminal of the cascode switch of the first cascode circuit being connected via a fourth switch to the second supply terminal, and a second terminal of the cascode switch of the second cascode circuit being able to be connected via a fifth switch to the second supply terminal, so that the current pulse is able to be provided by the second terminal of the cascode switch of the first cascode circuit or by the second terminal of the cascode switch of the second cascode circuit. Thus, a bridge circuit may be implemented, the load being situated in the bridge branch.

Moreover, the device may include at least one load, which is connected between the second terminal of the signal transistor and the second supply terminal, in order to be operated using the current pulse. The load may be an ultrasonic transducer, for example. Accordingly, the current pulse may be suitable for activating an ultrasonic transducer. Alternatively, the current pulse may be adjusted in its magnitude, steepness of curve as well as pulse duration to another load that is to be operated.

The present invention also provides a method for generating a current pulse, having the following steps: making available a supply voltage between a first supply terminal and a second supply terminal; and making available a first actuation signal to a first switch that is developed, as a function of the actuation signal, for switching a control current between the first supply terminal and the second supply terminal by a control transistor of a current mirror, in order thereby to generate the current pulse through a signal transistor of the current mirror. In a further step, at least one control signal is able to be applied to at least one cascode circuit, which is able to be coupled to a second terminal of the signal transistor.

The present invention also provides a control unit that is developed to carry out or implement the steps of the method according to the present invention. The object of the present invention may be achieved quickly and efficiently by this embodiment variant of the present invention in the form of a control unit, as well.

DETAILED DESCRIPTION OF THE INVENTION

In the subsequent description of exemplary embodiments of the present invention, the same reference numerals are used for the functionally same elements shown in the various figures, repeated description of these elements then being omitted. "Connected" is intended to encompass the meaning of connected electrically conductively, this being able to be a direct connection between two connection points. Alternatively, additional elements, resistors, for instance, may be situated between two connection points, and the connection may run via the additional elements.

Figure 1:
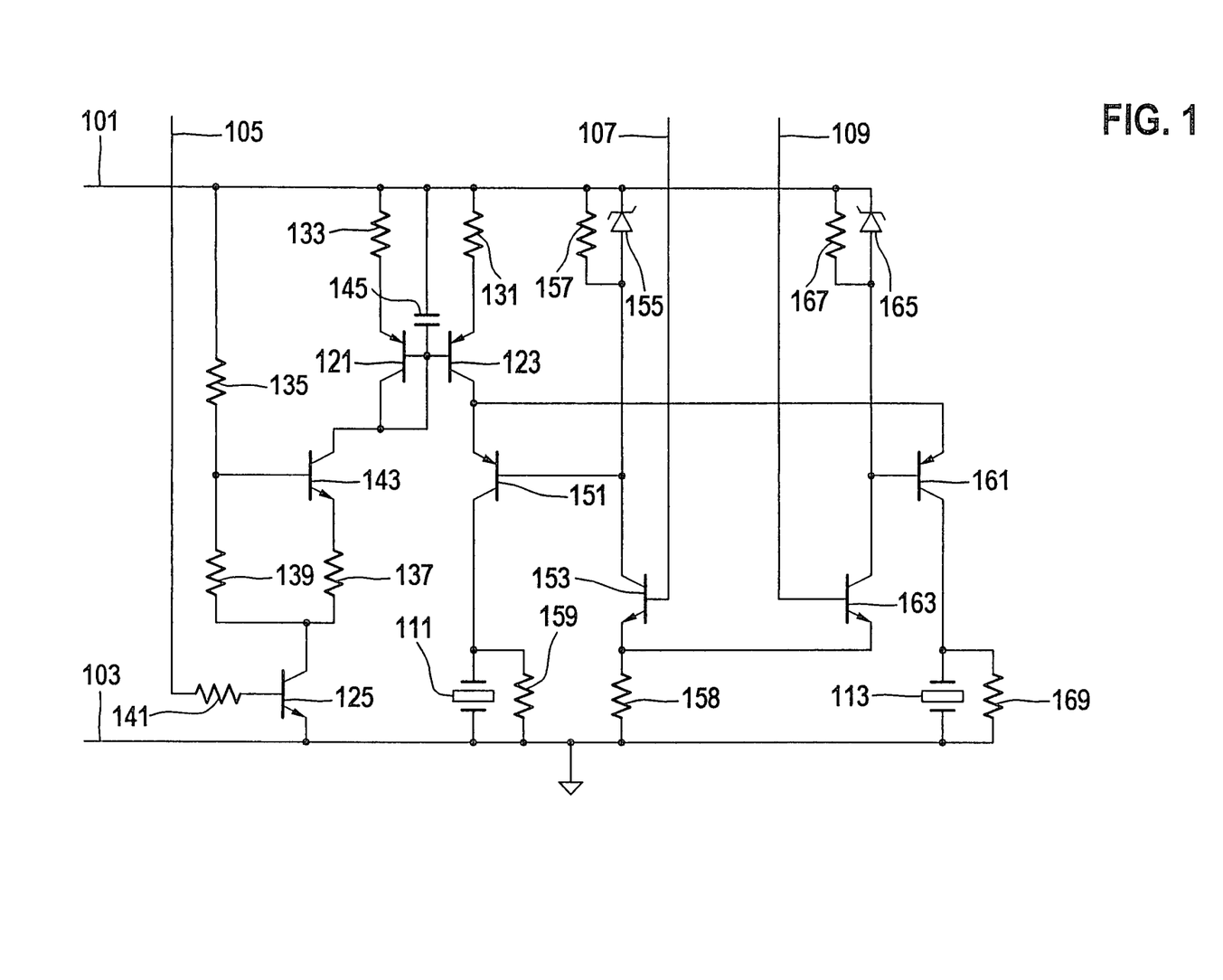
FIG. 1 shows a circuit diagram of a device according to an exemplary embodiment of the present invention.

FIG. 1 shows a device for generating a current pulse, according to one exemplary embodiment of the present invention. A corresponding circuit diagram is shown of the electronics according to the present invention.

The device has a first supply terminal 101, a second supply terminal 103, as well as a terminal 105 for providing an actuation signal, and terminals 107, 109 for providing control signals. A power supply voltage $U_{in}$ for the voltage supply of the device may be provided to first supply terminal 101. Second supply terminal 103 may be a ground terminal GND (represented by the ground symbol). At terminal 105, an actuation signal "enable" may be made available to the circuit, at terminal 107 a control signal "11" and at terminal 109 a control signal "12". Apart from the logical values, that are to be provided by the signals, at terminals 105, 107, 109 first voltage values or second voltage values, or first or second current values may be provided, which are each suitable for switching appropriate switches or transistors.

Using the device, according to this exemplary embodiment, a first load 111 and a second load 113 may be actuated. Loads 111, 113 may be ultrasonic transducers.

The device has a current mirror for this, which includes a control transistor 121 and a signal transistor 123. A control current through control transistor 121 may be switched on or off by a switch, a transistor 125, according to this exemplary embodiment. For this, transistor 125 is connected to terminal 105, so that the control current is able to be switched via the actuation signal.

The device has a plurality of resistors 131, 133, 135, 137, 141 and an additional transistor 143. Control transistor 121 is connected via resistor 133, and signal transistor 123 is connected via resistor 131 to first supply terminal 101. Control transistor 121 is connected via transistor 143, resistor 137 and transistor 125 to second supply terminal 103. Transistor 125 is connected via resistors 139, 135 to first supply terminal 101. One terminal of transistor 125 is connected via resistor 141 to terminal 105. One terminal of transistor 143 is connected to resistors 135, 139. The control terminals of control transistor 121 and of signal transistor 123 are connected to each other. Moreover, a further terminal of control transistor 121 is connected both to the control terminal of control transistor 121 and of signal transistor 123.

According to this exemplary embodiment, an emitter of control transistor 121 is connected to resistor 133 and an emitter of signal transistor 123 is connected to resistor 131. The base of control transistor 121 is connected to the base of signal transistor 123. The collector of control transistor 121 is connected to the collector of signal transistor 143. The emitter of transistor 143 is connected to a first terminal of resistor 137. A second terminal of resistor 137 is connected to the collector of transistor 125. The emitter of transistor 125 is connected to second supply terminal 103. The base of transistor 125 is connected to resistor 141. The collector of transistor 125 is connected to a first terminal of resistor 139. The second terminal of resistor 139 is connected to the base of transistor 143 and to a first terminal of resistor 135. A second terminal of resistor 135 is connected to the collector of transistor 101.

According to this exemplary embodiment, a capacitor 145 is connected between first supply terminal 101 and the base of control transistor 121 and the base of signal transistor 123. Thus, a first terminal of capacitor 145 is connected to first supply terminal 101, and a second terminal of capacitor 145 is connected to the base of transistor 121 and the base of transistor 123.

The collector of signal transistor 123 is developed to provide current for operating loads 111, 113. The current made available by the collector of signal transistor 123 corresponds to the current flowing through control transistor 121, based on the properties of the current mirror, but multiplied by a factor selected by resistors 131 and 133. A first terminal of loads 111, 113 is in each case connected to the collector of signal transistor 123. The second terminal of loads 111, 113 is connected to second supply terminal 103.

According to this exemplary embodiment, loads 111, 113 are each actuated using a cascode circuit. The cascode circuit allocated to load 111 is connected via a transistor 151 to the collector of signal transistor 123. The cascode circuit may further have a transistor 153, a Zener diode 155 and resistors 157, 158. A resistor 159 may be connected in parallel to load 111. A current flow between the collector of signal transistor 123 and load 111 may be interrupted or disconnected via transistor 151. According to this exemplary embodiment, the emitter of transistor 151 is connected to the collector of signal transistor 123, and the collector of transistor 151 is connected to the first terminal of load 111. The base of transistor 151 is connected to the collector of transistor 153 and to a first terminal of resistor 157 and the anode of Zener diode 155. The cathode of Zener diode 155 and the second terminal of resistor 157 are connected to first supply terminal 101. The emitter of transistor 153 is connected via resistor 158 to terminal 103. The base of transistor 153 is connected to first control terminal 107. Because of this, a voltage potential may be set at the base of transistor 151, via a control signal provided at first control terminal 107. Consequently, the current flow to load 111 is able to be controlled via first control terminal 107.

Second load 113 may be actuated via a further cascode circuit, which may correspond to the cascode circuit for actuating first load 111. Accordingly, the additional cascode circuit may have, in a corresponding manner, transistors 161, 163, a Zener diode 165 and resistors 167, 169. The emitter of transistor 163, which corresponds to transistor 153, may be connected to second supply terminal 103 via resistor 158. The base of transistor 163 may be connected to second control terminal 109. Thus, a current flow to load 113 may be controlled via a second control signal, that is made available at control terminal 109.

Consequently, FIG. 1 shows a circuit diagram of the present invention. A basic functional description of the circuit according to the present invention is described below, in the light of an exemplary embodiment of the present invention.

The power supply voltage is connected between terminal 101 $U_{in}$ and ground 103 (GND).

When enable input 105 is at ground potential ("low"), transistor 125 blocks. Then the voltage at its collector rises to $U_{in}$. All additional transistors 143, 121, 123, 151, 163 also block, and the closed-circuit current of the entire circuit is practically zero. Input signals 11 and 12 at terminals 107, 109 should also be low, that is, should be at ground potential.

If a sufficient positive voltage is applied at enable input 105, for instance, a 1.8 V logic level or higher, transistor 125 switches through. Then there is also a current flowing through transistor 143, and the current mirror having transistors 121, 123 is activated. As soon as a high potential, that is, for instance, a 1.8 V logic level or higher is also applied at terminal 107 11 or at terminal 109 12, transistor 153, 163, connected to them, switch through, and as a result, so do cascode transistor 151 or 161, respectively. The corresponding load 111, 113 then receives the current established by the current mirror, together with damping resistor 159, 169 that are connected in parallel.

Provided the cascode and the current mirror do not reach saturation, this current is determined, in a simplified manner, by $$I_{load}=(U_{in}\cdot R139/(R135+R139)/R137)\cdot R133/R131$$

The base-emitter voltages and the base currents of transistors 121, 123, 125, 143, 151, 161 are ignored, in this instance. R139 corresponds to the resistance value of resistor 139, R135 to the resistance value of resistor 135, R137 to the resistance value of resistor 137, R133 to the resistance value of resistor 133 and R131 to the resistance value of resistor 131.

It turns out that load current $I_{load}$ is approximately proportional to power supply voltage $U_{in}$, in order to prevent the saturation of the source. By using nonlinear impedances for at least one of resistors 131, 133, 135, 137, 139, this current correction may be adjusted as desired.

The greater capacitor 145 is selected, that is, the greater the capacitance value of capacitor 145 is, the slower run the edge slopes, triggered by control signals 11 and 12, that are provided at terminals 107, 109, that is, the EMI radiation is reduced. At a certain capacitance of capacitor 145, that is dependent on the remaining selection of components, the current runs nearly rectangularly.

Any number of cascode circuits may be connected to the current mirror, depending on how many loads 111, 113 are to be activated.

Figure 2A:
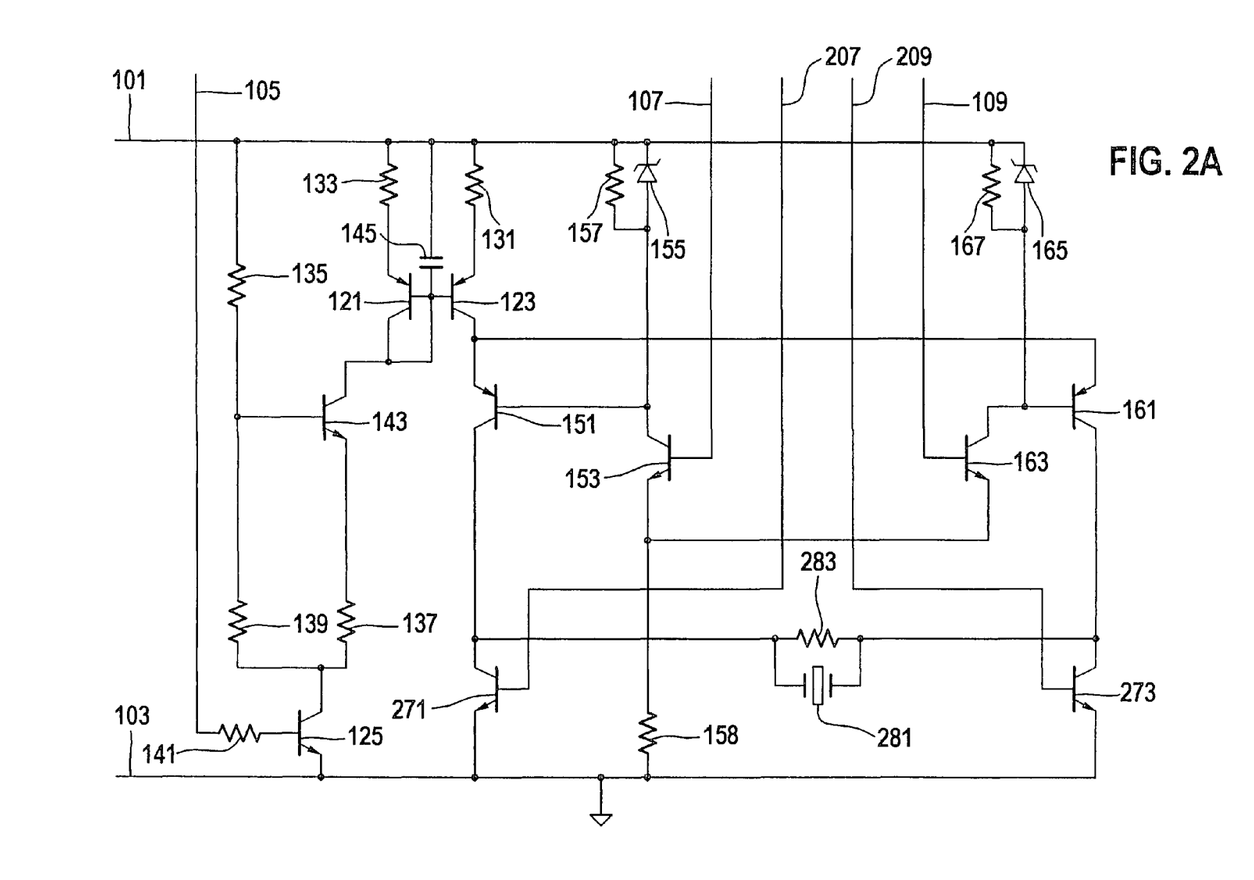
FIG. 2a shows a circuit diagram of a device according to an additional exemplary embodiment of the present invention.

FIG. 2a shows an exemplary embodiment of the device according to the present invention, in which a load 281 in the form of an H-bridge is able to be activated, by the combination of two cascode circuits having two additional transistors 271, 273. The output power at equal power supply voltage is doubled thereby, and a direct voltage component is prevented.

The circuit shown in FIG. 2a differs from the circuit shown in FIG. 1 in that transistors 271, 273 are situated in place of loads 111, 113, and a load 281, together with a resistor 283 connected in parallel, is connected as a bridge between transistors 151, 161, 271, 273. Two additional control signals are able to be received via two additional terminals 207, 209. Thus, a control signal 11 may be provided to the control input of transistor 153 via terminal 107, a control signal 12 may be provided to a control input of transistor 271 via terminal 207, a control signal 13 may be provided to the control input of transistor 273 via terminal 209, and a control signal 14 may be provided to the control input of transistor 163 via terminal 109.

According to this exemplary embodiment, the collector of transistor 151 is connected to the collector of transistor 271. The emitter of transistor 271 is connected to second supply terminal 103. The base of transistor 271 is connected to terminal 207. Corresponding to this, the collector of transistor 161 is connected to the collector of transistor 273. The emitter of transistor 273 is connected to second supply terminal 103. The base of transistor 273 is connected to terminal 209. The collector of transistor 151 and the collector of transistor 271 are connected to a first terminal of load 281 and to a first terminal of resistor 283. Correspondingly, the collector of transistor 161 and the collector of transistor 273 are connected to a second terminal of load 281 and to a first terminal of resistor 283.

This exemplary embodiment offers a connection possibility of load 281, in the form of an H-bridge circuit. As a function of the voltage potentials made available at terminals 107, 109, 207, 209, a current provided by the current mirror is able to flow either through transistor 151, load 281 and transistor 273 to ground terminal 103 or through transistor 161, load 281 and transistor 271 to ground terminal 103. Consequently, load 281 is able to have current flowing through it in opposite directions, respectively.

The circuit according to the present invention is able to be converted using a subtle implementation. The approach according to the present invention is suitable for use in ultrasonic flow rate measurement, but it may also be used in other fields if ultrasonic transducers or other loads having high resistance are to be provided with pulse currents.

Figure 2B:
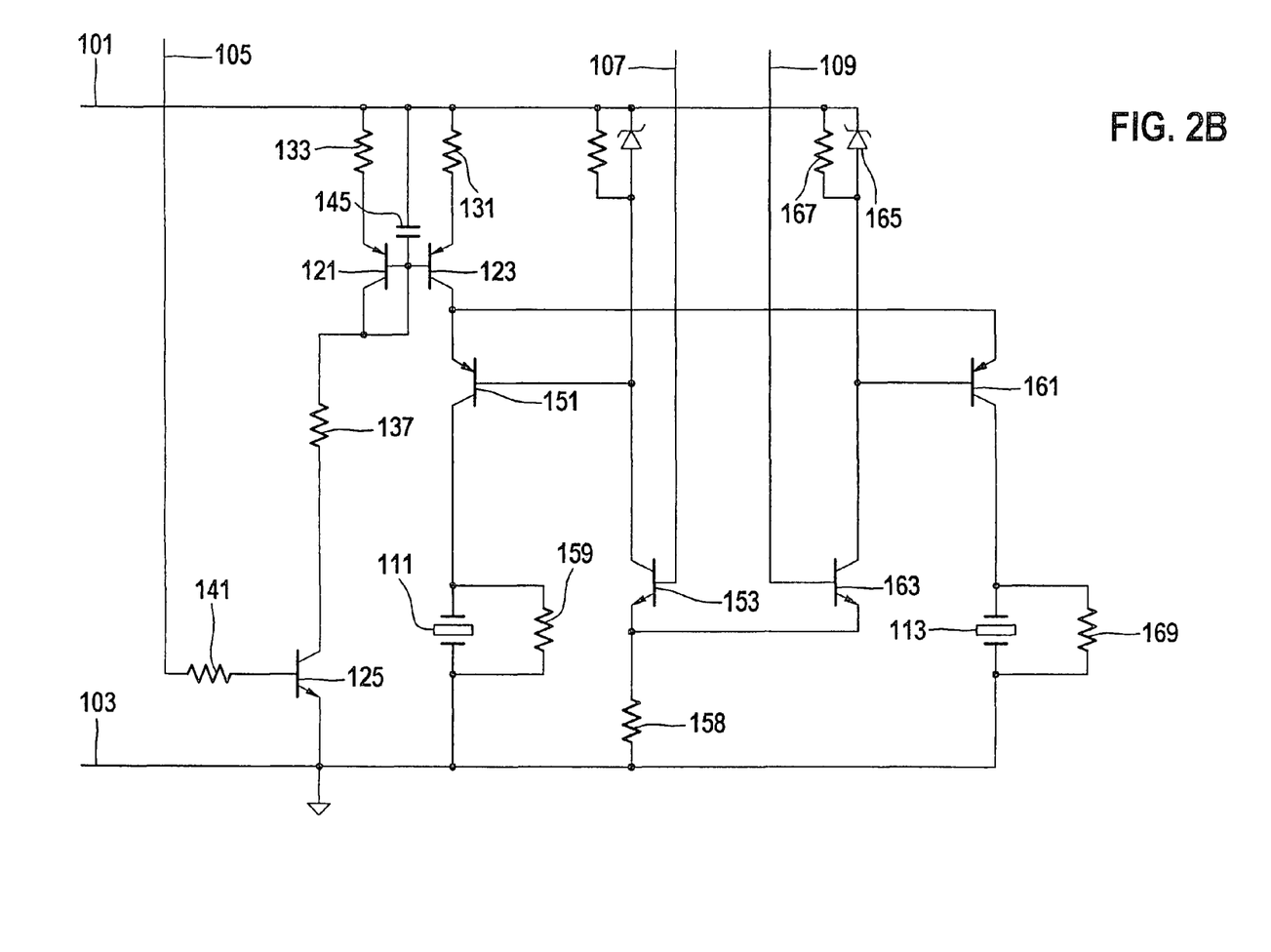
FIG. 2b shows a circuit diagram of a device according to an additional exemplary embodiment of the present invention.

FIG. 2b shows an alternative or rather a simplification of the circuit shown in FIG. 1. In this context, resistors 135 and 139 as well as transistor 143 are omitted, and resistor 137 is connected at its first terminal to the collector of control transistor 121. Thereby the current, that flows through control transistor 121, and with that, also the current for operating loads 111, 113 are not specified quite as high-ohmic as in the circuit according to FIG. 1. This, however, stands opposed to the simpler construction of the circuit. This circuit variant may equally be combined with FIG. 2a.

Figure 3:
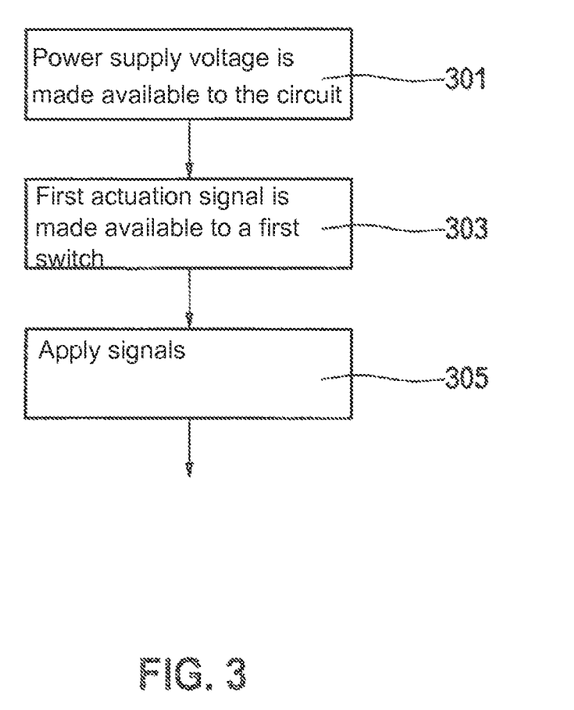
FIG. 3 shows a flow chart of a method according to the present invention.

FIG. 3 shows a flow chart of a method for generating a current pulse, according to one exemplary embodiment of the present invention. The method may be used in connection with the circuits shown in FIGS. 1, 2a and 2b, for example.

In a step 301, a power supply voltage is made available to the circuit. In a step 303, a first actuation signal is made available to a first switch. Using the actuation signal, a control current or reference current of a current mirror may be switched. In this way, as a function of the actuation signal, a signal current corresponding to the control current may be made available by the current mirror. The signal current may be used for operating a load, such as an ultrasonic transducer. For instance, the actuation signal may be made available for a first time period, in which the signal current is supposed to flow, having a first signal level. The actuation signal may be made available for a second time period, in which the signal current is not supposed to flow, having a second signal level. After that, the actuation signal may be made available again having the first signal level.

In an additional step 305, signals 107, 109, 207, 209, shown in the preceding figures, may be applied. Signals 107, 109, 207, 209, and also the actuation signal, may be intermittent.

The exemplary embodiments described and shown in the figures have been selected only in exemplary fashion. Different exemplary embodiments are able to be fully combined with one another, or with regard to individual features. One exemplary embodiment may also be supplemented by features of another exemplary embodiment. Furthermore, method steps according to the present invention may also be carried out repeatedly, as well as in a different sequence than the one described.

What is claimed is:

1. A device for producing a current pulse, comprising:
a first supply terminal and a second supply terminal configured to provide a power supply voltage between the first and second supply terminals;
a first switch situated in a control current branch between the first and second supply terminals, wherein the first switch is configured to switch a control current through the control current branch as a function of an actuation signal; and
a current mirror having a control transistor and a signal transistor, wherein the control transistor and the signal transistor each have a first terminal, a second terminal and a control terminal, and wherein the control transistor is situated in series to the first switch in the control current branch, and wherein the signal transistor is configured to make available the current pulse as a function of the control current through the control transistor;

wherein the first terminal of the signal transistor is connected via a first resistor to the first supply terminal, and wherein the first terminal of the control transistor is connected via a second resistor to the first supply terminal; and a second switch, a third resistor, a fourth resistor and a fifth resistor, wherein the second terminal of the control transistor is connected to a first terminal of the second switch, a second terminal of the second switch is connected via the fourth resistor to the first terminal of the first switch, a control terminal of the second switch is connected via the third resistor to the first supply terminal and connected via the fifth resistor to the first terminal of the first switch.

2. The device as recited in claim 1, further comprising:
an actuation signal terminal configured to provide the actuation signal:
wherein:
a control terminal of the first switch is connected to the actuation signal terminal;
a second terminal of the first switch is connected to the second supply terminal;
the control terminal of the control transistor is connected to the control terminal of the signal transistor;
the first terminal of the control transistor and the first terminal of the signal transistor are connected to the first supply terminal; and
the second terminal of the control transistor is connected to the control terminal of the control transistor, the control terminal of the signal transistor, and to a first terminal of the first switch, so that the current pulse is provided at the second terminal of the signal transistor as a function of the actuation signal.

3. The device as recited in claim 2, further comprising:
a capacitor connected between the first supply terminal and the control terminal of the control transistor, wherein the capacitor has a capacitance value selected to set a steepness of curve of the current pulse.

4. The device as recited in claim 2, wherein the device includes at least one cascode circuit coupled to the second terminal of the signal transistor.

5. The device as recited in claim 4, wherein the device includes at least one first cascode circuit and at least one second cascode circuit, wherein the first cascode circuit is configured to make available the current pulse to a first terminal of a load as a function of at least one first control signal, and wherein the second cascode circuit is configured to make available the current pulse to a second terminal of the load as a function of at least one second control signal.

6. The device as recited in claim 2, wherein at least one load is connected between the second terminal of the signal transistor and the second supply terminal in order to be operated using the current pulse.

7. The device as recited in claim 6, wherein the current pulse is suitable for actuating an ultrasonic transducer.

8. The device as recited in claim 1, wherein at least one of the first, second, third, fourth and fifth resistors has a nonlinear characteristics curve.

9. A device for producing a current pulse, comprising:
a first supply terminal and a second supply terminal configured to provide a power supply voltage between the first and second supply terminals;
a first switch situated in a control current branch between the first and second supply terminals, wherein the first switch is configured to switch a control current through the control current branch as a function of an actuation signal; and a current mirror having a control transistor and a signal transistor, wherein the control transistor and the signal transistor each have a first terminal, a second terminal and a control terminal, and wherein the control transistor is situated in series to the first switch in the control current branch, and wherein the signal transistor is configured to make available the current pulse as a function of the control current through the control transistor an actuation signal terminal configured to provide the actuation signal:
wherein:
a control terminal of the first switch is connected to the actuation signal terminal;
a second terminal of the first switch is connected to the second supply terminal;
the control terminal of the control transistor is connected to the control terminal of the signal transistor;
the first terminal of the control transistor and the first terminal of the signal transistor are connected to the first supply terminal; and
the second terminal of the control transistor is connected to the control terminal of the control transistor, the control terminal of the signal transistor, and to a first terminal of the first switch, so that the current pulse is provided at the second terminal of the signal transistor as a function of the actuation signal;
wherein the device includes at least one cascode circuit coupled to the second terminal of the signal transistor;
wherein the device includes at least one first cascode circuit and at least one second cascode circuit, wherein the first cascode circuit is configured to make available the current pulse to a first terminal of a load as a function of at least one first control signal, and wherein the second cascode circuit is configured to make available the current pulse to a second terminal of the load as a function of at least one second control signal;
wherein:
the at least one first cascode circuit has a cascode switch and a third switch;
a control terminal of the third switch is connected to a control terminal configured to provide a control signal;
a first terminal of the third switch is connected to the first supply terminal and a control terminal of the cascode switch;
a second terminal of the third switch is connected to the second supply terminal;
a first terminal of the cascode switch is connected to the second terminal of the signal transistor; and
the current pulse is able to be provided at a second terminal of the cascode switch.

10. The device as recited in claim 9, wherein:
a second terminal of the cascode switch of the first cascode circuit is connected via a fourth switch to the second supply terminal; and
a second terminal of the cascode switch of the second cascode circuit is connected via a fifth switch to the second supply terminal, so that the current pulse is able to be provided by one of the second terminal of the cascode switch of the first cascode circuit or the second terminal of the cascode switch of the second cascode circuit.

11. A method for generating a current pulse, comprising:
providing a power supply voltage between a first supply terminal and a second supply terminal;
providing a first actuation signal to a first switch configured to switch a control current between the first supply terminal and the second supply terminal through a control transistor of a current mirror as a function of the first actuation signal, so as to generate the current pulse through a signal transistor of the current mirror; and applying at least one control signal to at least one cascode circuit coupled to a second terminal of the signal transistor, wherein the control transistor and the signal transistor each have a first terminal, a second terminal and a control terminal, and wherein the control transistor is situated in series to the first switch in the control current branch, and wherein the signal transistor is configured to make available the current pulse as a function of the control current through the control transistor;

wherein the first terminal of the signal transistor is connected via a first resistor to the first supply terminal, and wherein the first terminal of the control transistor is connected via a second resistor to the first supply terminal; and wherein a second switch, a third resistor, a fourth resistor and a fifth resistor are provided such that the second terminal of the control transistor is connected to a first terminal of the second switch, a second terminal of the second switch is connected via the fourth resistor to the first terminal of the first switch, a control terminal of the second switch is connected via the third resistor to the first supply terminal and connected via the fifth resistor to the first terminal of the first switch.

* * * * *